(12) United States Patent
Hughes

(10) Patent No.: US 9,084,375 B2
(45) Date of Patent: Jul. 14, 2015

(54) AIRFLOW MODULE AND DATA STORAGE DEVICE ENCLOSURE

(75) Inventor: Robert W. Hughes, Emsworth (GB)

(73) Assignee: Seagate Technology LLC, Cupertino, CA (US)

( * ) Notice: Subject to any disclaimer, the term of this patent is extended or adjusted under 35 U.S.C. 154(b) by 1464 days.

(21) Appl. No.: 12/274,041

(22) Filed: Nov. 19, 2008

(65) Prior Publication Data

US 2009/0135558 A1    May 28, 2009

Related U.S. Application Data

(60) Provisional application No. 60/990,182, filed on Nov. 26, 2007.

(51) Int. Cl.
*H05K 5/00* (2006.01)
*H05K 7/00* (2006.01)
*H05K 7/20* (2006.01)

(52) U.S. Cl.
CPC ................... *H05K 7/20727* (2013.01)

(58) Field of Classification Search
CPC .......... H05K 7/20727; H05K 7/20536; H05K 7/20709; H05K 7/20; G11B 33/142
USPC .......................................... 454/184; 361/695
See application file for complete search history.

(56) References Cited

U.S. PATENT DOCUMENTS

| | | | |
|---|---|---|---|
| 5,414,591 A * | 5/1995 | Kimura et al. ................. | 361/695 |
| 5,912,799 A * | 6/1999 | Grouell et al. ............ | 361/679.32 |
| 6,198,633 B1 * | 3/2001 | Lehman et al. ............... | 361/756 |
| 6,313,988 B1 * | 11/2001 | Pham ....................... | 361/679.33 |
| 6,480,379 B1 * | 11/2002 | Dickey et al. ............. | 361/679.51 |
| 6,525,935 B2 * | 2/2003 | Casebolt .................... | 361/679.46 |
| 6,563,706 B1 * | 5/2003 | Strickler ...................... | 361/695 |
| 6,728,099 B1 * | 4/2004 | Tsang et al. .................. | 361/678 |
| 7,042,717 B2 * | 5/2006 | El-Batal et al. .......... | 361/679.33 |
| 7,099,154 B2 * | 8/2006 | Ishiyama ..................... | 361/695 |
| 7,269,006 B2 * | 9/2007 | Miyamoto et al. ....... | 361/679.48 |
| 7,307,840 B2 * | 12/2007 | Hartung ....................... | 454/184 |
| 7,515,410 B1 * | 4/2009 | Dingfelder et al. ...... | 361/679.33 |

(Continued)

FOREIGN PATENT DOCUMENTS

WO    WO-2006100441 A1 *   9/2006

OTHER PUBLICATIONS

Storage Bridge Bay Working Group, Inc., Storage Bridge Bay (SBB) Specification version 1.0, Sep. 21, 2006.*

*Primary Examiner* — Alissa Tompkins
*Assistant Examiner* — Phillip E Decker
(74) *Attorney, Agent, or Firm* — Hall Estill Attorneys at Law

(57) ABSTRACT

An airflow module for being received in a module bay of a data storage device enclosure is disclosed. The airflow module comprises a body having: a first face having a first opening therein; a second face having a second opening therein, the first face being adjacent to the second face; and, an airflow channel between the first opening and the second opening so as to allow the passage of air between the first opening and the second opening. The first and second openings are arranged to co-operate with airflow openings in modules positioned in adjacent bays of a said data storage device enclosure to direct a cooling stream of air between said modules in use. The airflow channel is free from components that generate substantial amounts of heat in their normal operation.

20 Claims, 14 Drawing Sheets

(56) References Cited

U.S. PATENT DOCUMENTS

| | | | |
|---|---|---|---|
| 7,554,811 B2 * | 6/2009 | Scicluna et al. | 361/725 |
| 7,558,056 B2 * | 7/2009 | Suzuki et al. | 361/679.49 |
| 7,558,074 B2 * | 7/2009 | Liang | 361/796 |
| 7,586,745 B1 * | 9/2009 | Szelong et al. | 454/184 |
| 7,800,894 B2 * | 9/2010 | Davis | 361/679.33 |
| 7,878,888 B2 * | 2/2011 | Rasmussen et al. | 454/184 |
| 7,983,032 B2 * | 7/2011 | Walker et al. | 361/679.33 |
| 8,240,485 B2 * | 8/2012 | Bushby et al. | 211/26 |
| 2003/0030978 A1 * | 2/2003 | Garnett et al. | 361/687 |
| 2004/0036995 A1 * | 2/2004 | Suzuki et al. | 360/69 |
| 2005/0057898 A1 * | 3/2005 | El-Batal et al. | 361/695 |
| 2005/0219809 A1 * | 10/2005 | Muncaster et al. | 361/685 |
| 2005/0248919 A1 * | 11/2005 | Suzuki et al. | 361/687 |
| 2007/0127206 A1 * | 6/2007 | Wade et al. | 361/685 |
| 2007/0188996 A1 * | 8/2007 | Liang | 361/752 |
| 2007/0253157 A1 * | 11/2007 | Atkins et al. | 361/685 |
| 2008/0101020 A1 * | 5/2008 | Curtis et al. | 361/695 |
| 2008/0148303 A1 * | 6/2008 | Okamoto et al. | 720/652 |
| 2008/0218949 A1 * | 9/2008 | Hughes | 361/679 |
| 2009/0016011 A1 * | 1/2009 | Wade | 361/684 |
| 2009/0103414 A1 * | 4/2009 | Joshi et al. | 369/75.11 |
| 2009/0122443 A1 * | 5/2009 | Farquhar et al. | 360/97.01 |
| 2009/0213544 A1 * | 8/2009 | Dittus et al. | 361/695 |
| 2012/0081856 A1 * | 4/2012 | Hopkins et al. | 361/679.33 |
| 2014/0262151 A1 * | 9/2014 | Cho et al. | 165/80.3 |

* cited by examiner

AIRFLOW MODULE AND DATA STORAGE DEVICE ENCLOSURE

This application claims the benefit of priority to U.S. application Ser. No. 60/990,182, filed Nov. 26, 2007, the contents of which is hereby incorporated by reference in its entirety.

The present invention relates to an airflow module, a data storage device enclosure and a method of cooling an electronics module that is received in a data storage device enclosure.

Data storage device enclosures known in the prior art are typically highly modular. These commonly comprise a chassis containing a midplane into which various modules can be plugged. The chassis provides data storage module bays at the front of the enclosure for receiving disk drive assemblies mounted in carriers. The chassis provides other bays at the rear of the enclosure for receiving various other modules, such as power supply units, cooling modules and controller modules. Some or all of the modules are normally removable from the chassis, allowing replacement of failed modules or upgrading or changing the functionality of the enclosure. Many layouts and configurations of data storage enclosures are possible and, indeed, available commercially.

The various components of the enclosure generate heat, which must be removed from the enclosure to keep the operating temperature of the components within acceptable limits or else the performance and reliability of the enclosure will be impaired. To this end, an airflow is commonly provided through the enclosure and the various bays of the enclosure by one or more air movement devices, such as fans or blowers, within the enclosure.

The modules themselves are normally very particular about their requirements for cooling. The electronics modules usually comprise a housing with apertures to allow cooling air to be drawn through its housing. The enclosure in which the module is received provides the air flow. However, there are potentially many different cooling schemes that a module may require depending on for example the number and position of vents and the amount of airflow required to cool a module of a given power rating. Also, there are potentially many different cooling schemes that a storage enclosure can adopt. The different schemes of the module and of the storage enclosure are not necessarily compatible. Thus the module has to be precisely matched to the enclosure to ensure that the correct airflow is provided. This creates a lack of flexibility in matching modules to an enclosure. This is exacerbated by recent trends in the industry to create more interoperability between modules and enclosures.

For example, the Storage Bridge Bay (SBB) specification is an industry-wide specification aimed at standardising certain aspects of the design of enclosures and modules to allow for greater interoperability between the enclosures and modules of different manufactures. In particular, the SBB standard has defined an electronics module (a so-called "canister") that can use any combination of three outlet vents provided in the canister to drive cooling air through the canister. It is expected that most modules will use either the primary cooling vent, i.e. the top vent (Vent 1 in the specification), or the secondary cooling vents, i.e. the side vents (Vents 2 and 3 in the specification), or a combination of the primary and secondary vents. However, the SBB does not require enclosures to support cooling by both the primary and secondary vents. Thus enclosures are being developed that can cool the canister either by using Vent 1 or by Vents 2 and 3 but not both. This means that a module requiring cooling via Vent 1 may not be usable with an enclosure that provides cooling via Vents 2 and 3.

According to a first aspect of the present invention, there is provided an airflow module for being received in a module bay of a data storage device enclosure, the airflow module comprising a body having: a first face having a first opening therein; a second face having a second opening therein, the first face being adjacent to the second face; and, an airflow channel between the first opening and the second opening so as to allow the passage of air between the first opening and the second opening, wherein the first and second openings are arranged to co-operate with airflow openings in modules positioned in adjacent bays of a said data storage device enclosure to direct a cooling stream of air between said modules in use; and the airflow channel is free from components that generate substantial amounts of heat in their normal operation.

The airflow module may be placed in a bay that is adjacent to a bay containing for example an electronics module and may be used to enhance the cooling airflow through the electronics module by forming a new or additional air flow path via the air flow channel. This may be advantageously used for example in an arrangement where it is desired to use an electronics module with a particular cooling arrangement with a storage enclosure that is arranged to provide a different cooling arrangement to the electronics module.

For example, the storage enclosure may be arranged to provide "side cooling", i.e. where cooling air is drawn through the electronic module bay through side vents, whereas the electronics module may be arranged to require "top cooling", i.e. where the electronics module has a vent in its top face through which cooling air is drawn. In this situation, the prior art offers no adequate solution to allow the electronics module to be used with the storage enclosure. The airflow module as described above may be placed in an adjacent bay to the electronics module and arranged such that the first opening of the airflow module is next to the vent in the top face of the electronics module and the second opening of the airflow module is next to the side of its bay. Thus the side cooling provided by the storage enclosure is in communication with the airflow channel of the airflow module, which in turn is in communication with the top vent of the electronics module, thus forming an airflow path that allows the storage enclosure to draw cooling air through the electronics module.

In a further example, the storage enclosure may be arranged to provide "side cooling", i.e. where cooling air is drawn through the electronic module bays through side vents, whereas the electronics module is versatile and requires side cooling or top cooling. Thus the storage enclosure provides side cooling to the electronics module. However, by placing the airflow module in an adjacent bay to the electronics module, an additional airflow path is made to provide top cooling to the electronics module. Thus the airflow of a module may be increased, allowing an electronics module to be used with an enclosure, where the electronics module has a higher heat generating rating than can be cooled by side cooling alone.

The airflow module may comprise at least one guide runner to allow the airflow module to be guided into and out of a received position in a said module bay of a data storage device enclosure. The airflow module may comprise a handle for allowing the airflow module to be inserted into or removed from a said module bay, and/or for latching the airflow module into position in a said module bay. This allows the airflow module to be more easily correctly positioned in the storage enclosure.

In an embodiment, the body comprises a third face, wherein the third face is orthogonal to the first and second faces, and the third face is closed to the passage of air therethrough.

This allows the airflow module to also act as a blank for the bay in which it is positioned. Often, the bay in which the airflow module is positioned will have an airflow channel by which air can be drawn through the bay to cool an electronics module in the bay. The third face acts as a blank to close off this airflow channel, which is not needed as it does not contain an electronics module. Closing it off has the advantage of not reducing the effective airflow of the other bays.

In a further embodiment, the body comprises a fourth face, wherein the fourth face opposes the third face, and the fourth face is closed to the passage of air therethrough. The fourth face acts as a blank to close off undesired airflow channels.

In a preferred embodiment, the first opening is sized and positioned so as to be adjacent to and at least partially overlapping with a primary airflow vent of a canister according to the Storage Bridge Bay version 1.0 specification when the airflow module is positioned adjacent to and on top of a said canister, so as to permit airflow between the primary vent of the canister and the airflow channel of the airflow module.

In a preferred embodiment, the second opening is sized and positioned so as to be adjacent to and at least partially overlapping with a secondary airflow vent of a canister according to the Storage Bridge Bay version 1.0 specification when the airflow module is positioned adjacent to and side-by-side with a said canister, so as to permit airflow between the secondary vent of the canister and the airflow channel of the airflow module.

This allows canisters (i.e. electronics modules) compliant with the Storage Bridge Bay version 1.0 specification and arranged to be cooled via the primary vent as defined by the specification to be cooled in an enclosure arranged to provide side cooling.

In a preferred embodiment, the body comprises a fifth face, wherein the fifth face is opposed to the second face, and the fifth face has a third opening therein, wherein said airflow channel extends between the first opening, the second opening and the third opening so as to allow the passage of air between the first opening, the second opening and the third opening.

This arrangement may be useful when used with an enclosure capable of cooling a module via two vents. An example would be an enclosure that can provide side cooling to an electronics module received in a bay of the enclosure via both side faces of the module.

In a preferred embodiment, the body is cuboid. This makes the airflow module particularly suitable for use with an enclosure according to the SBB standard. The body may have a first dimension of about 205.5±1 mm and a second dimension of about 34.5±1 mm. This gives the airflow module a width and height making the airflow module particularly suited to being received in a bay of an enclosure according to the SBB standard. The body may have a dimension of between about 75 mm and about 300 mm. This gives the airflow module a depth suited to being received in a bay of an enclosure according to the SBB standard.

In an embodiment, the body comprises a hollow box-like structure, said faces of the body being provided by walls of the box and said openings being provided by respective holes in the walls. This provides an arrangement of the airflow module that is simple to manufacture.

According to a second aspect of the present invention, there is provided a data storage device enclosure and an airflow module, the data storage device enclosure comprising: a first and a second module bay each for receiving a respective module, the module bays being positioned adjacent to each other, wherein at least the first module bay has at least one airflow aperture in a face of the bay via which air can be drawn through the first module bay; the airflow module being received in the first module bay and comprising a body having: a first face having a first opening therein; a second face having a second opening therein; and, an airflow channel between the first opening and the second opening so as to allow the passage of air between the first opening and the second opening, wherein the first opening is in fluid communication with the second module bay and the second opening is in fluid communication with the airflow aperture, such that in use air can be drawn in a path through the second module bay, through the airflow channel, and through the airflow aperture.

According to a third aspect of the present invention, there is provided a method of cooling an electronics module that is received in a data storage device enclosure, the electronics module having at least one airflow vent via which cooling air may be drawn through the module, the method comprising: positioning the electronics module in a first module bay of the enclosure; positioning an airflow module in a second module bay of the enclosure, wherein the second module bay is adjacent the first module bay and has at least one airflow aperture via which air can be drawn through the second module bay, wherein the airflow module comprises a body having a first face having a first opening therein, a second face having a second opening therein, and an airflow channel between the first opening and the second opening, the airflow module being positioned such that the first opening is in fluid communication with the airflow vent of the module and the second opening is in fluid communication with the airflow aperture of the second module bay; and, drawing air through the electronics module via the airflow vent in the electronics module, the airflow channel in the airflow module, and the airflow aperture in the second module bay so as to cool the electronics module.

Embodiments of the present invention will now be described by way of example with reference to the accompanying drawings, in which.

Figure 1A:
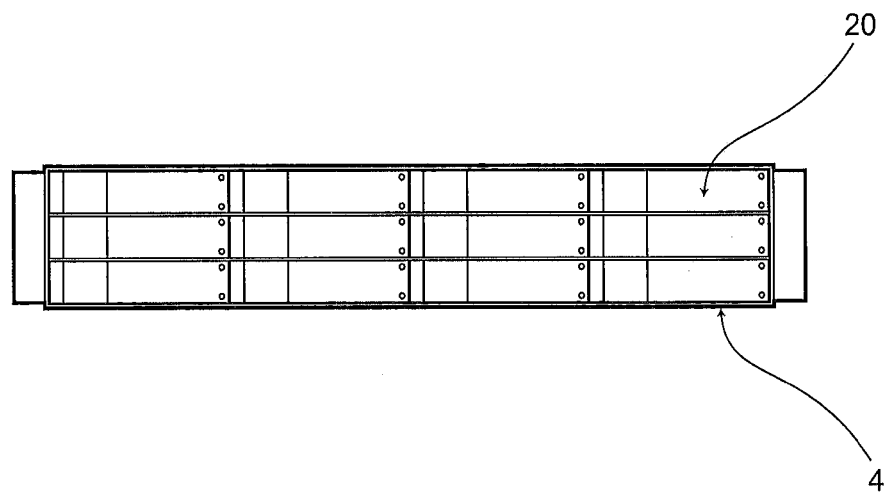
FIG. 1A shows schematically from the front a data storage device enclosure.
Figure 1B:
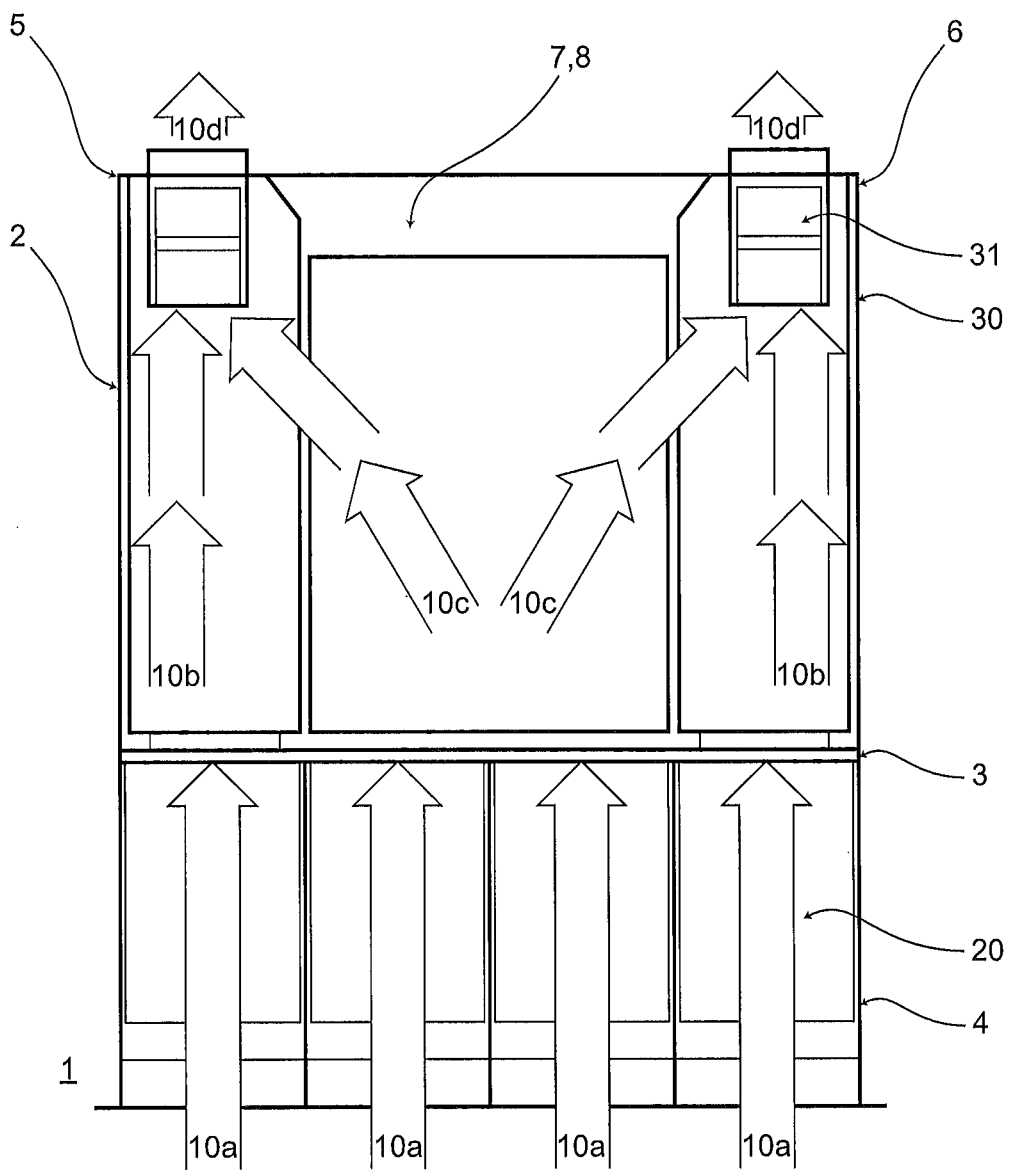
FIG. 1B shows schematically from the top a data storage device enclosure.
Figure 1C:
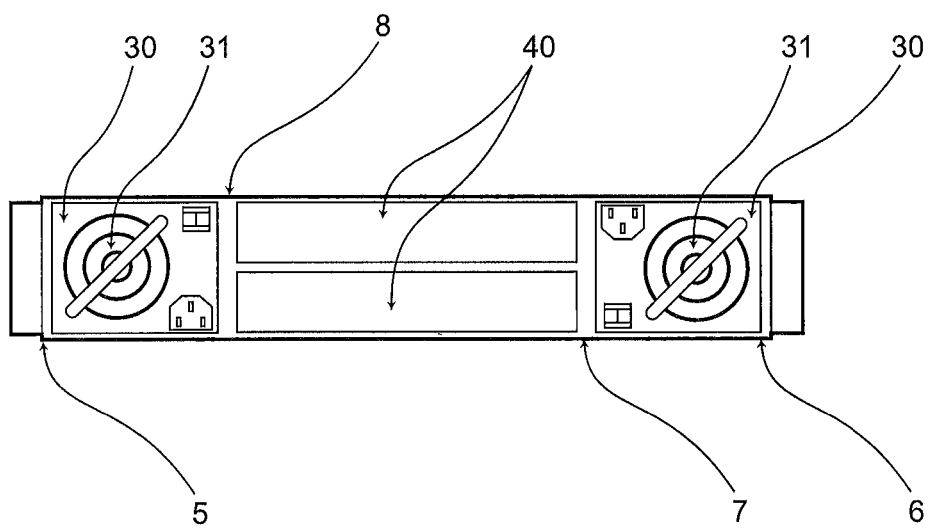
FIG. 1C shows schematically from the rear a data storage device enclosure.

The data storage device enclosure 1 of FIGS. 1A-C comprise a chassis 2 containing a midplane 3 into which various modules are plugged to allow data and power to be communicated among the modules. The chassis 2 has a plurality of bays 4 at the front for receiving disk drive assemblies 20 in carriers. At the rear of the chassis 2 are first and second bays 5,6, one at each side, for receiving power supply modules 30. Between the power supply bays 5,6 are first and second bays 7,8, one on top of the other, for receiving electronics modules 40. The modules are removable from the chassis 2, allowing replacement of failed modules or upgrading or changing the functionality of the enclosure 1. However, in other embodiments, the power supply modules 30 may be formed integrally with the chassis 2 and not removable from the chassis 2.

The various components of the enclosure 1 generate heat, which must be removed from the enclosure 1 to keep the operating temperature of the components within acceptable limits or else the performance and reliability of the enclosure 1 may be impaired. To this end, it is common in the art of storage enclosures 1 to provide an airflow 10 through the enclosure 1 and the various bays of the enclosure 1 by one or more air movement devices, such as fans or blowers, within the enclosure 1.

In the present example, a "front-to-rear" airflow is used. In this scheme, the enclosure 1 has apertures in the front face of the enclosure 1, which allow air to be drawn into the enclosure 1. The power supply units 30 incorporate fans 31 positioned at their rear. The fans 31 draw the air into the enclosure 1 via the apertures in the front face, through the enclosure 1, and finally expel the heated air at the rear of the enclosure 1.

The path taken by the air within the enclosure 1 is as follows. After being drawn into the enclosure 1 through the apertures in the front face, the air 10a first passes among the disk drive units 20 in the front bays 4 of the enclosure 1. The air then passes through apertures (not shown) in the midplane 3 into the rear bays 5,6,7,8 of the enclosure 1. The air 10b,10c is drawn into the various modules, i.e. the power supplies 30 and the electronics modules 40, received in the rear bays 5,6,7,8 through air inlets in the modules 30,40 that are adjacent the midplane 3. The air 10b entering the power supply units 30 from the midplane 3 is drawn through the power supply units 30 and expelled (air flow 10d) at the rear of the enclosure 1 by the fans 31. The electronics modules 40 have outlet vents in their side walls aligned with corresponding inlet vents in the side walls of the power supplies 30 that allow air to pass between the two. Thus, the air 10c entering the electronics modules 40 from the midplane 3 is drawn by the fans 31 of the power supply units 30 through the electronics modules 40 and into the power supply units 30 before being expelled (air flow 10d) at the rear of the enclosure 1.

Note, in order for air to pass between adjacent modules 30,40 in the enclosure 1 the interior walls of the chassis 2 are provided with appropriately positioned and sized apertures to allow the air to pass.

Figure 2A:
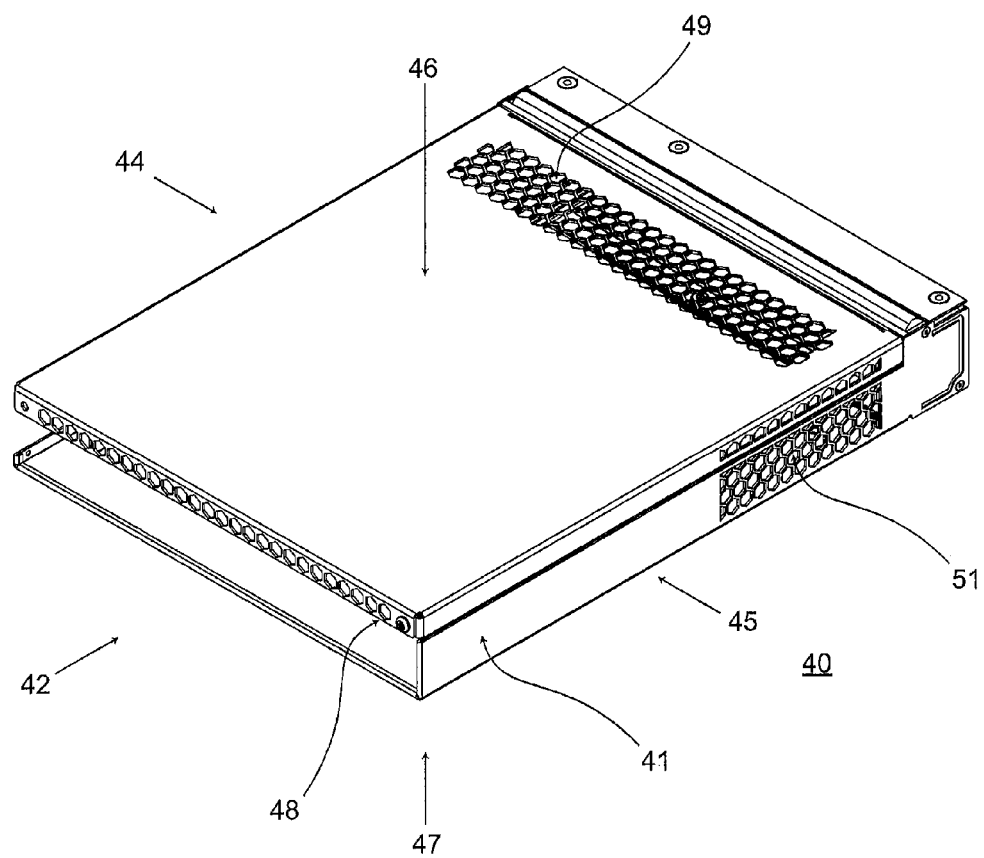
FIGS. 2A and 2B show a perspective view of a prior art electronics module viewed from the rear, top and side and from the front, rear and side respectively.
Figure 2B:
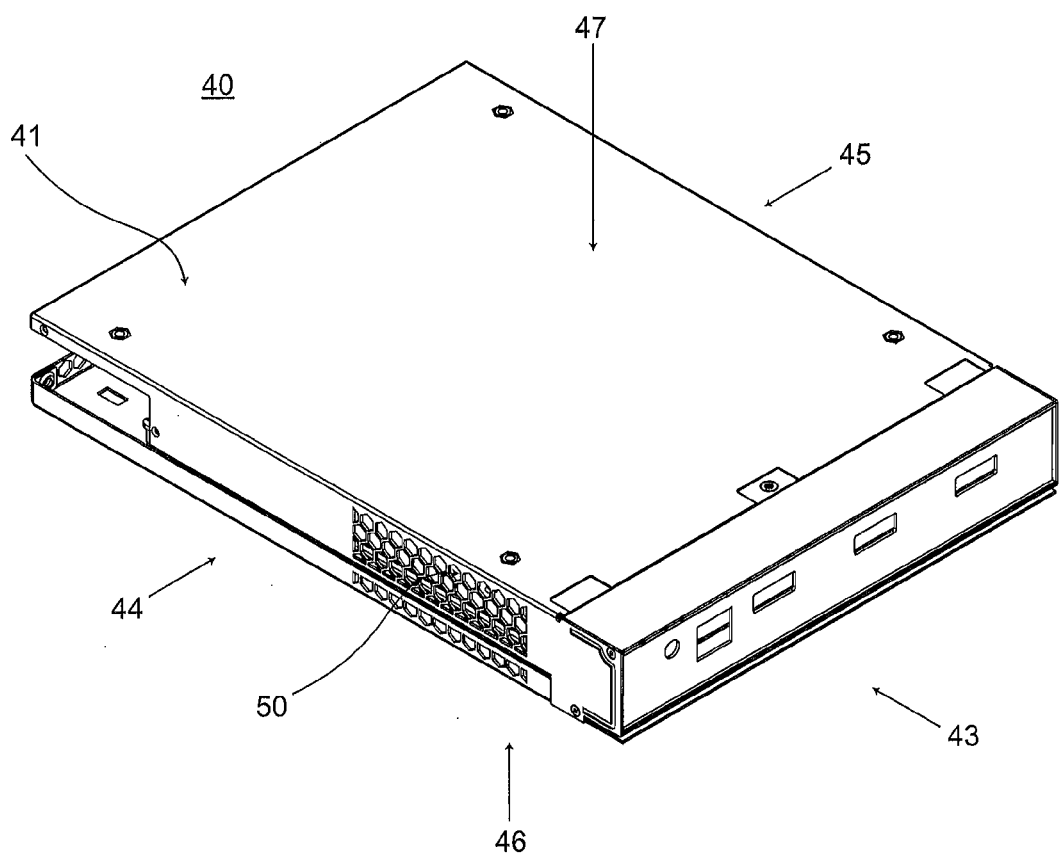

FIGS. 2A and 2B show an example of an electronics module 40 for use with a data storage device enclosure 1, for example such as the enclosure shown by FIGS. 1A-C. The electronics module 40 may provide for example a controller for the storage enclosure 1, for example organising the disk drives as a Redundant Array of Inexpensive Disks or a Switched Bunch Of Disks (SBOD) or Just a Bunch Of Disks (JBOD).

The electronics module 40 comprises a housing 41, having a front face 42 and a rear face 43, first and second side faces 44,45 and top and bottom faces 46,47. The front face 42 has connectors (not shown) by which the electronics module 40 plugs into the midplane 3 when the electronics module 40 is inserted into the enclosure 1. The rear face 43 is accessible at the rear of the enclosure 1 when the electronics module 40 is received in the enclosure 1 and has connectors thereon by which external connection may be made to the electronics module 40, for example to communicate with a host computer or suchlike.

The housing 41 has an air inlet 48 in its front face 42. This allows cooling air to be drawn into the housing 41. The housing 41 also has three outlet vents where air can leave the housing 41: a top vent 49 on the top face 46 of the housing 41, and first and second side vents 50,51 on the side faces 44,45 of the housing 41. In this example, the electronics module 40 complies with the Storage Bridge Bay specification (wherein the electronics module is known as a "canister"). In particular, the size and shape of the housing 41 and the position of the air inlet 48 and outlet vents 49,50,51 are in accordance with the SBB specification.

The SBB specification requires that an electronics module 40 according to the specification should be capable of being cooled by at least one of three specified cooling schemes. In each cooling scheme air enters the housing 41 of the electronics module 40 through the air inlet 44. In each cooling scheme the electronics module 40 has no air movement device within, but instead relies on the enclosure 1 to provide an air movement device (e.g. the fans 31 in the enclosure of FIGS. 1A-C) to draw air through the electronics module, by drawing the air out of one or more of the vents 49,50,51. The different cooling schemes described by the SBB specification require the air to be draw through the housing 41 entering through the air inlet 44 and exiting in one of three ways: either (i) through the top vent 49, or (ii) through the side vents 50,51, or (iii) through a combination of both the top vent 49 and the side vents 50,51.

Figure 3A:
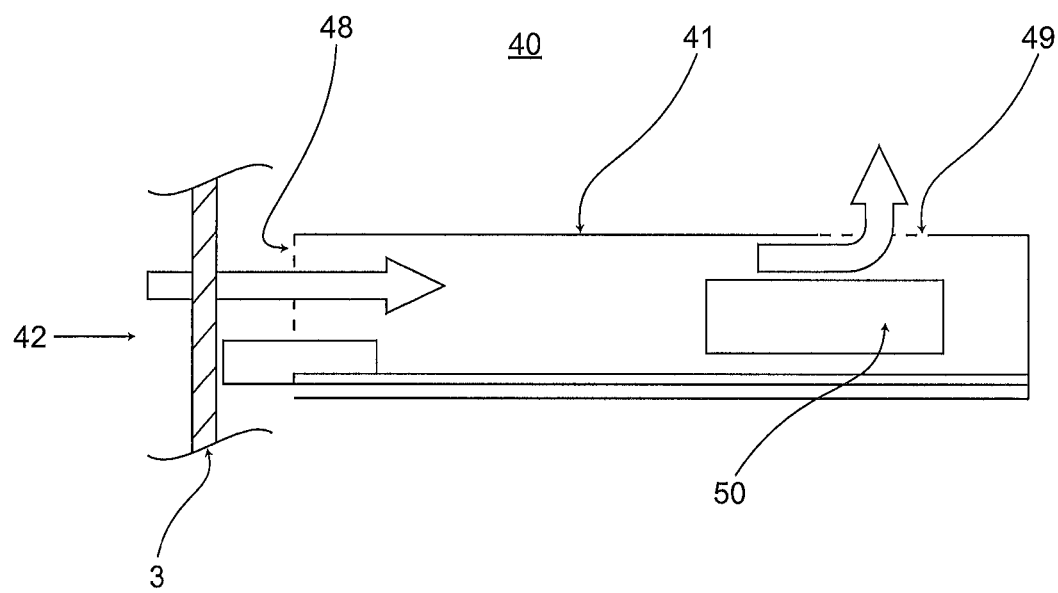
FIGS. 3A and 3B shows schematically examples of cooling airflow used with the module of FIGS. 1A and 1B.
Figure 3B:
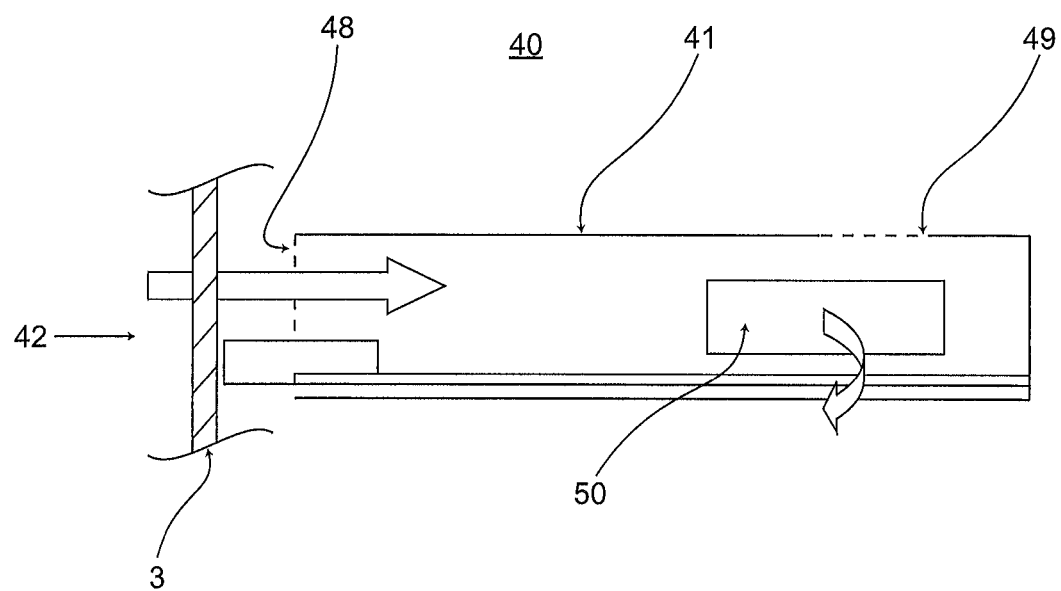

FIGS. 3A and 3B show two examples of these cooling schemes. FIG. 3A shows an electronics module being cooled via the top vent 49 ("top cooling"). FIG. 3B shows an electronics module 40 being cooled via one or both of the side vents 50,51 ("side cooling"). In each case, air is drawn into the module 40 through the air inlet 48 in its front face 42. The air is then drawn past the heat generating electronic components (not shown) in the interior of the module 40, thereby cooling them. In FIG. 3A, the air is drawn out of the electronics module 40 via the top vent 49. In FIG. 3B, the air is drawn out of the module 40 via the side vents 50,51.

As will be appreciated, the storage enclosure 1 shown by FIGS. 1A-C is arranged to provide side cooling of the electronics modules 40. In other words, due to the position and arrangement of the electronics modules 40 and the power supplies 30, the power supplies 30 draw air 10c through the electronics modules 40 through the side vents 50,51 of the electronics modules 40. Thus for an electronics module 40 to be used with the particular enclosure 1 of FIGS. 1A-C it must be capable of being cooled by side cooling, i.e. by having air drawn through its side vents 50,51. Conversely, ordinarily, an electronics module 40 that is capable of top cooling only, i.e. by having air drawn through the top vent 49, cannot be used with this enclosure 1, since the enclosure 1 is arranged to use side cooling.

This creates a problem in the interchangeability and compatibility of modules 40 and enclosures 1. These problems are not limited to the particular arrangement of modules or enclosure described, nor to SBB compliant modules, but rather is applicable to all sorts of module arrangements in such enclosures.

Figure 4:
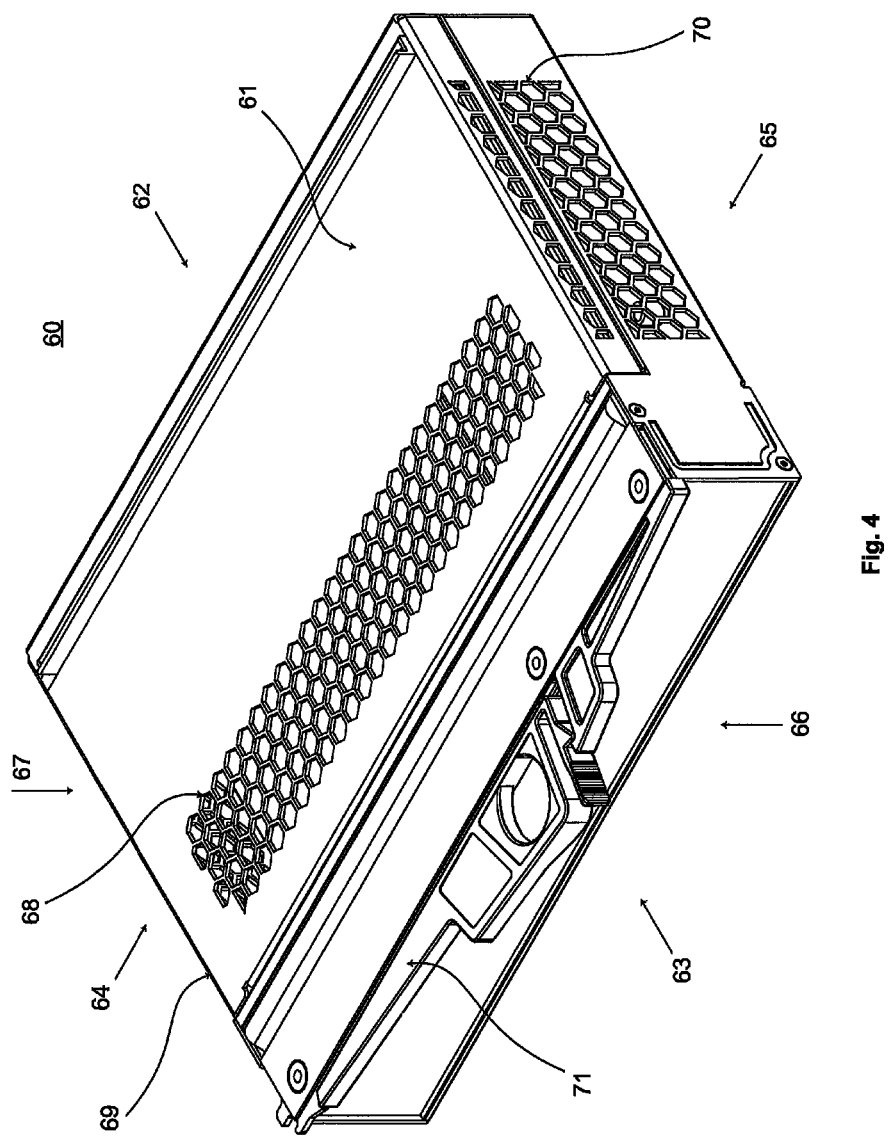
FIG. 4 shows a perspective view, in part from below, of an example of an airflow module according to an embodiment of the present invention.

FIG. 4 shows an example of an airflow module 60 in accordance with an embodiment of the present invention viewed in part from below. The airflow module 60 comprises a hollow cuboid box-shape housing 61 having a front face 62 and a rear face 63, first and second side faces 64,65 and a top and a bottom faces 66,67. The housing 61 has three vents: a bottom vent 68 on its bottom face 67, a first side vent 69 on its first side face 64 and a second side vent 70 on its second side face 65. An airflow channel (not shown) extends between the bottom vent 68 and the side vents 69,70 so as to allow the passage of air between the between the three vents 68,69,70. In this example, the housing 61 is constructed from sheet metal walls, with the vents 68,69,70 being provided by a mesh in the walls and the airflow channel being provided by the hollow interior of the housing 61. The mesh can be provided by stamping appropriate holes in the walls or by attaching a separate mesh to cover apertures in the walls.

The height and width of this example of the airflow module 60 and the positions of the vents 68,69,70 are in accordance with those of a canister as defined by the SBB specification. The airflow module 60 is thus sized to be received into an electronics module bay 7,8 of a storage enclosure 1, for example such as shown in FIGS. 1A-C, with its vents 67,68, 69 being in a similar position to that of an electronics module 60 received in that bay 7,8 (except that the bottom vent 68 is on the opposite face to that of the electronics module 40). The airflow module 60 has a handle 71 to aid its insertion into and removal from an enclosure 1. The handle 71 incorporates a latching mechanism that allows the airflow module 60 to be secured in position in the enclosure 1. The airflow module 60 may also have guide rails on its side faces 64,65 (not shown) to facilitate its insertion into the enclosure 1 and/or to secure it in position in the enclosure 1.

The airflow module 60 may be advantageously used with an electronics module 40 that is designed to be cooled via top cooling, i.e. via its top vent 49, and an enclosure 1 that is designed to provide side cooling to an electronics module 40 received therein, such as for example the enclosure 1 shown by FIGS. 1A-C. The electronics module 40 is positioned in the first electronics module bay 7 of the enclosure 1. The airflow module 60 is positioned in the second electronics module bay 8 so as to be adjacent to the electronics module 40. When so positioned, the bottom vent 68 of the airflow module 60 is adjacent to and below the top vent 49 of the electronics module 40 such that air can pass between the interior of the electronics module 40 and the airflow module 60. Preferably, the bottom vent 68 of the airflow module 60 is coextensive with the top vent 49 of the electronics module 40 so as to provide the least resistance to airflow therebetween. The interior walls of the chassis 2 of the enclosure 1 have appropriately positioned apertures to allow airflow between the electronics module 40 and the airflow module 60.

Figure 5:
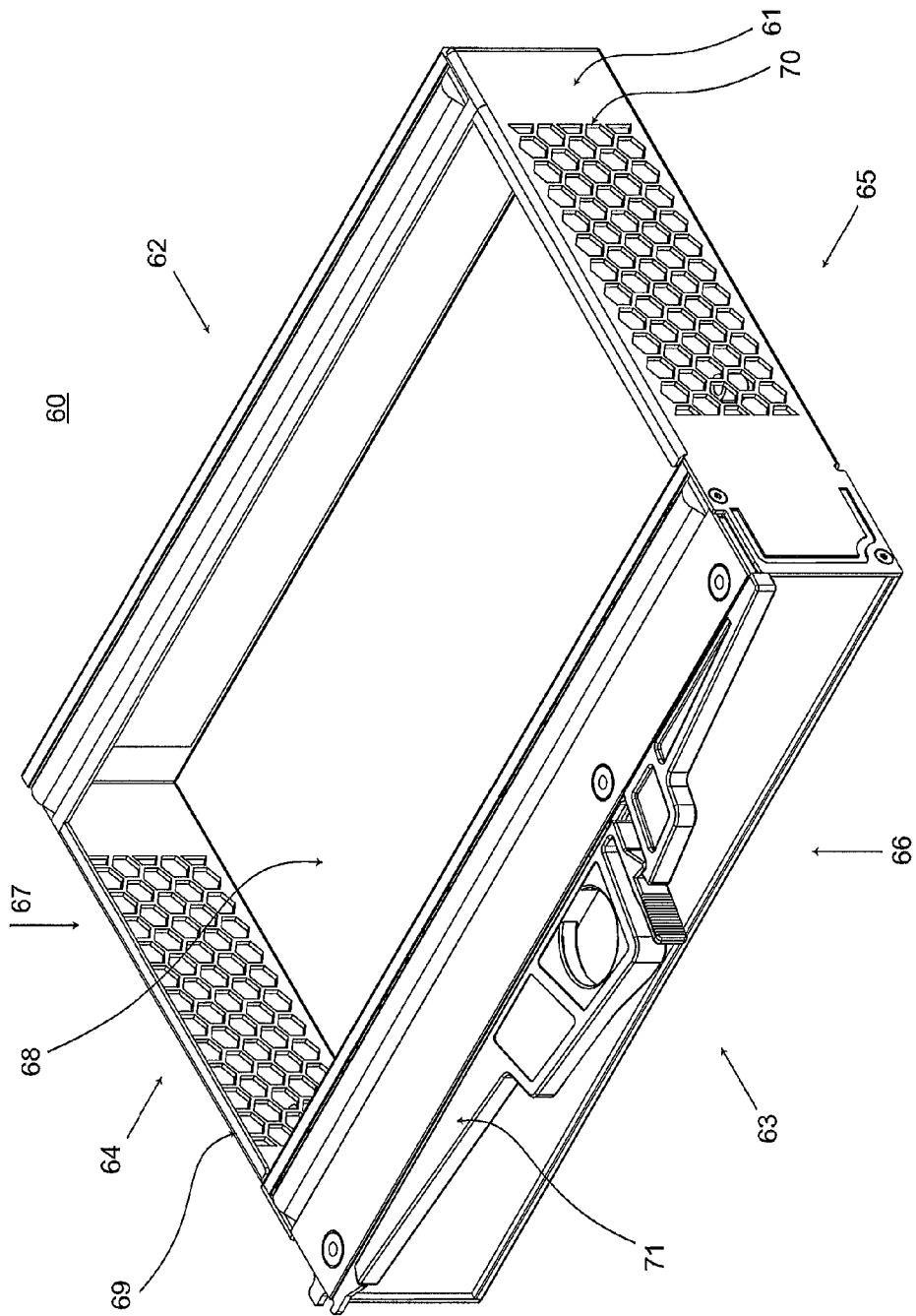
FIG. 5 shows a perspective view, in part from below, of another example of an airflow module according to an embodiment of the present invention.

FIG. 5 shows another example of an airflow module 60. This example is similar to the example of FIG. 4, except that the bottom vent 68 is provided by a large aperture in the bottom face 67 extending across substantially the whole width of the bottom face 67 and most of the depth of the bottom face 67. In another example, the bottom face 67 may be completely open.

Figure 6A:
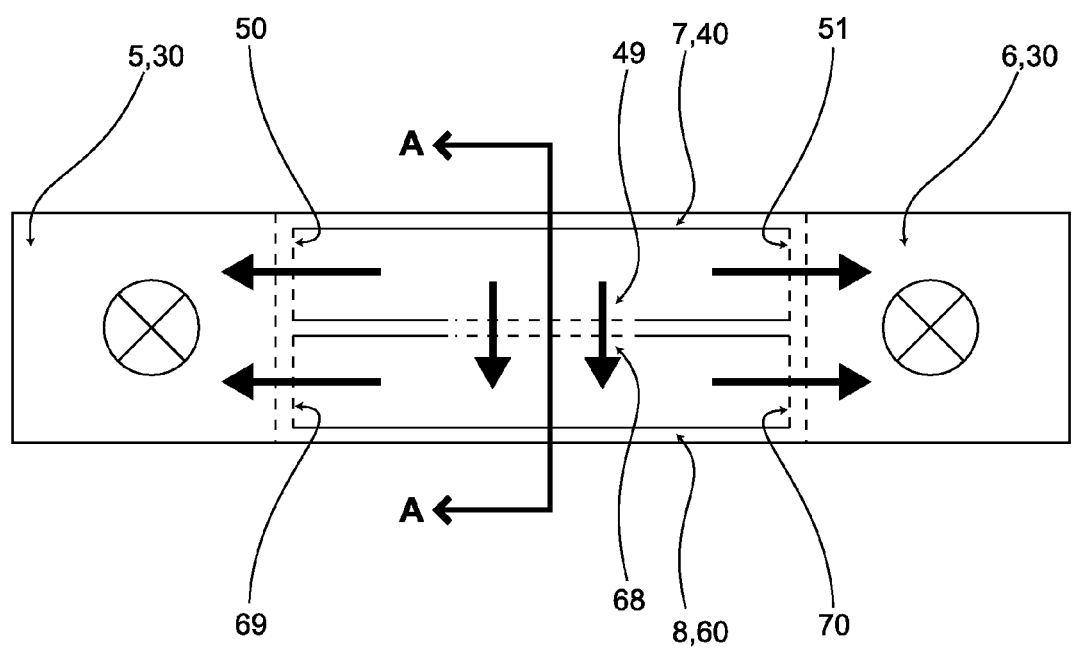
FIG. 6A shows schematically from the rear an example of cooling airflow in an enclosure used with the airflow module of FIG. 4 and the electronics module of FIGS. 2A and 2B.
Figure 6B:
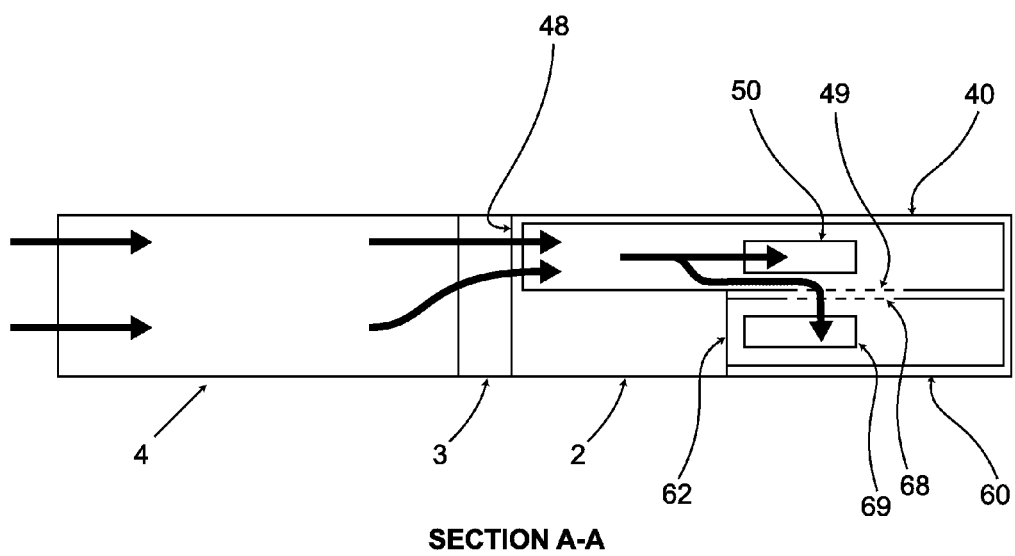
FIG. 6B shows a sectional view taken from FIG. 6A; and, FIG. 7A shows schematically from the rear an example of cooling airflow in another storage enclosure.

FIGS. 6A and 6B show an example of an airflow module 60 in use. FIG. 6A shows from the rear a storage enclosure 1 that is similar in layout to the storage enclosure of FIGS. 1A, 1B and 1C. FIG. 6B shows a sectional view of the enclosure along the line A-A. Power supply modules 30 are received in the first and second bays 5,6 at each side of the enclosure. An electronics module 40 is received in the first electronics module bay 7. An airflow module 60 is received in the second electronics module bay 8.

In use, as shown by FIGS. 6A and 6B, the airflow module 60 affects the airflow in the enclosure 1 in the following ways. Firstly, the airflow module 60 acts as a "blank". In other words, the front face 62 of the airflow module 60 prevents air flow straight through the bay 8 in which the airflow module 60 is placed. Were this not the case, then the power supplies 30 would draw air straight through the bay 8 from the midplane, with the result that, as this bay does not contain any heat generating components, the cooling air flow would be ineffective, reducing the overall cooling of the enclosure 1.

In addition to acting as a blank, the airflow module 60 provides a new airflow channel for cooling the electronics module 40 in bay 7. In this channel, air is drawn through the midplane 3 and into the bay 7. The air passes through the electronics module 40, cooling the components inside. The air can then take two paths depending on the type of the electronics module 40. If the electronics module 40 has side vents 50,51, then a portion of the air can be drawn through the side vents 50,51 directly into the power supply units 30. Whether or not the electronics module 40 has side vents 50,51, some or all of the air can pass through the top vent 49 of the electronics module 40 through the bottom vent 68 in the airflow module 60 through the channel in the airflow module 60 and into the power supply units 30 via the side vents 69,70 in the airflow module 60.

Thus, this arrangement allows a top cooled electronics module 40 to be used with a side cooled enclosure 1. Where the electronics module 40 supports both side and top cooling, the airflow module 60 allow the electronics module 40 to be used in a side cooled enclosure 1 whilst in addition allowing top cooling. This allows an electronics module 40 with a higher power rating to be cooled than would otherwise be possible.

Figure 7A:
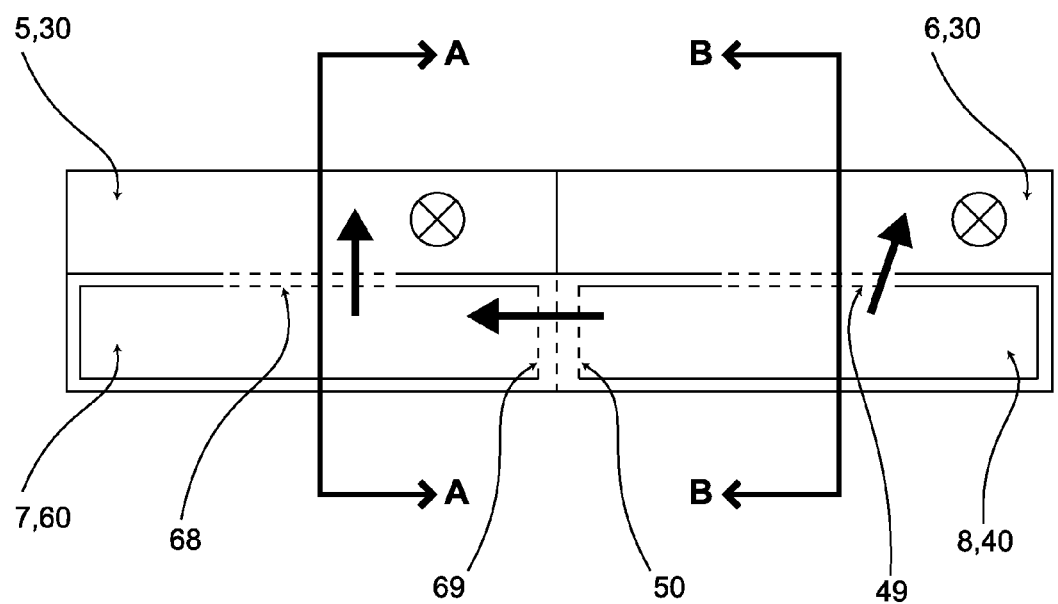
FIGS. 7B and 7C show sectional views taken from FIG. 7A.
Figure 7B:
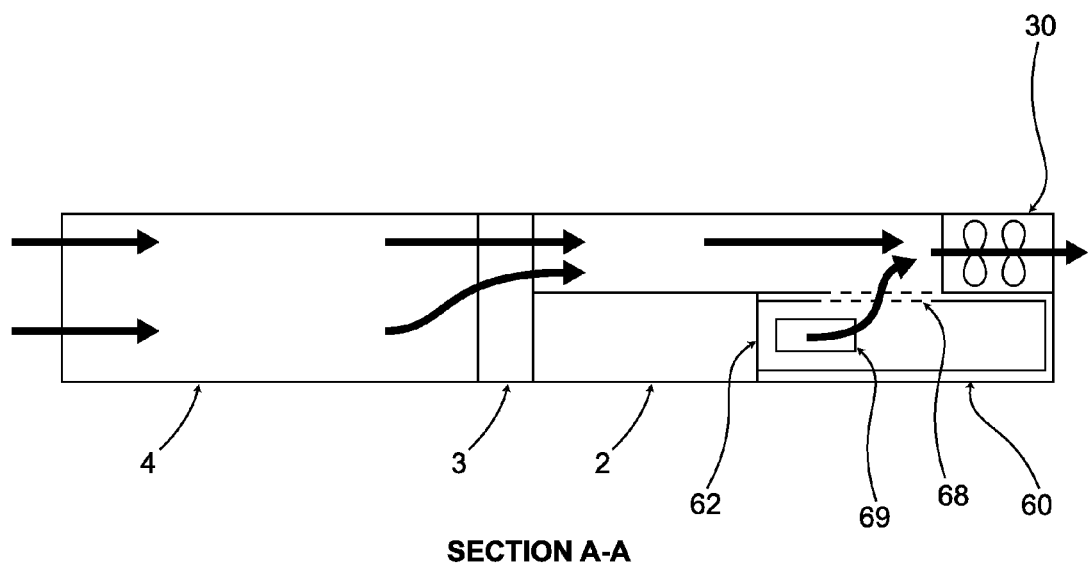
Figure 7C:
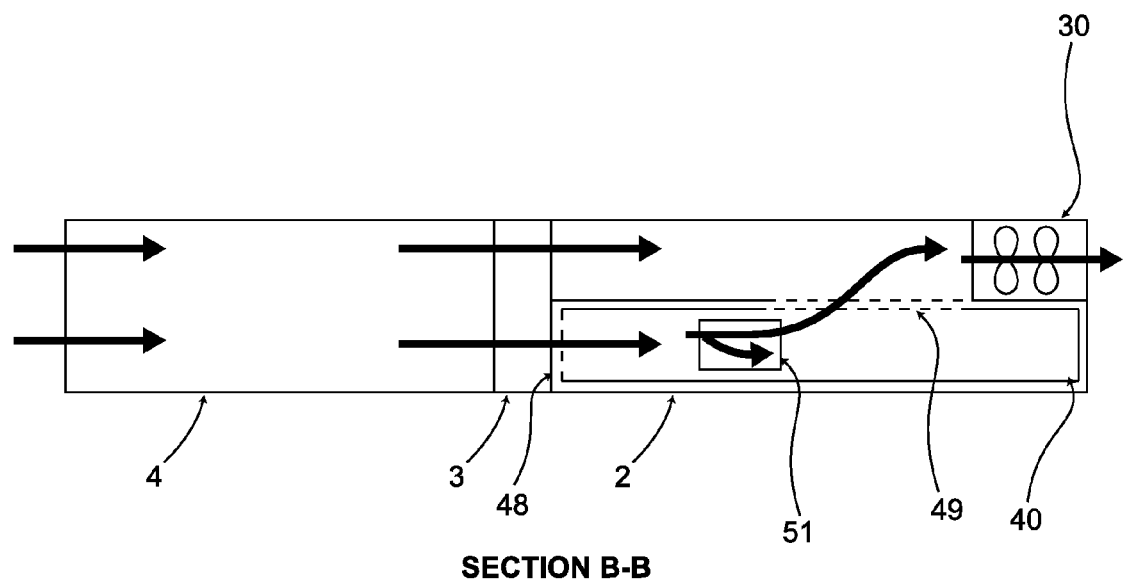

FIG. 7A shows from the rear another example of a storage enclosure 1, having a different layout of power supply module bays 5,6 and electronics module bays 7,8 to the enclosure 1 shown by FIGS. 1A-C. FIGS. 7B and 7C show sectional views of the enclosure along the lines A-A and B-B respectively. In this enclosure 1, the electronics modules bays 7,8 are positioned side-by-side in the chassis 2 with the power supply module bays 5,6 positioned side-by-side on top of the electronics module bays 7,8. The electronics module bays 7,8 are each capable of receiving electronics modules 40 compatible with the SBB specification, such as the electronics module 40 shown in FIGS. 2A and 2B. In normal use, each electronics module bay 7,8 would receive a respective electronics module 40 which would be cooled via its top vent 49 by the respective power supply 30 positioned above it.

In the example of cooling airflow shown in FIGS. 7A, 7B and 7C, an airflow module 60 is positioned in the first electronics module bay 7 in place of an electronics module 40, and an electronics module 40 is positioned in the second electronics module bay 8. Thus arranged, the first side vent 50 of the electronics module 40 is aligned with the first side vent 69 of the airflow module 60, and the top vent 68 of the airflow module 60 is aligned with the side inlet vent of the power supply module 30. This forms an airflow channel between the electronics module 40 and the first power supply 30. Thus, the electronics module 40 can be cooled by both the first and second power supply modules 30, via its top vent 49 and its side vent 50 respectively. This again allows greater cooling to be provided to the electronics module 40. Also, if one or more fans 31 in the second power supply module 30 fails, such that the power supply module 30 is no longer capable of drawing sufficient air to adequately cool the adjacent electronics module, the airflow channel provided by the airflow module 60 allows the electronics module 40 to be cooled by the first power supply module 30 so that the enclosure 1 can continue to operate.

Thus an adjacent bay 7,8 can be used with an airflow module 60 to improve the cooling of an electronics module 40 and increase the interchangeably of the electronics module 40.

It is contemplated that the airflow module 60 and in particular the airflow channel will be free of any components that generate substantial amounts of heat. In the airflow modules 60 of FIGS. 4 and 5, the modules contain no components at all, and thus contain no heat-generating components. Nonetheless, in other examples, it may be desired that the airflow module 60 contains some heat-generating components, for example batteries. This may be done to take advantage of the free space inside the airflow module 60. Since the air flowing through the channel of the airflow module 60 has already been used to cool the electronics modules 40, the cooling of the other modules in the enclosure 1 should not be significantly affected by this. A typical electronics module 40, for example one in accordance with the SBB v 1.0 specification, generates between 60 W to 200 W of heat. Where the airflow module 60 does contain some heat-generating components, it is preferred that the heat generated by these does not exceed say about 10 W or 20 W or so, or, more generally, say about no more than 10% of the heat generated by an electronics module 60 or other module cooled in the enclosure 1.

Embodiments of the present invention have been described with particular reference to the examples illustrated. However, it will be appreciated that variations and modifications may be made to the examples described within the scope of the present invention. In particular, the present invention has been described in relation to 2 U storage enclosures. However, other embodiments of the present invention may use 4 U storage enclosures or any other suitable layout of storage enclosure.

The invention claimed is:

1. A device enclosure comprising:
   an enclosure housing having a front end and a rear end;
   a plurality of data devices arranged within the enclosure housing adjacent the front end thereof;
   an electronics module disposed within the enclosure housing adjacent the rear end thereof comprising electronics for controlling the data devices, the electronics disposed within a rectilinear electronics module housing having opposing front and rear faces, opposing side faces and opposing top and bottom faces, the front face of the electronics module housing having an inlet opening in facing relation to the data devices, a selected one of the top or bottom faces of the electronics module housing having a first vent aperture extending therethrough, a selected one of the opposing side faces of the electronics module housing having a second vent aperture extending therethrough;
   an airflow module disposed within the enclosure housing adjacent the rear end thereof comprising an empty rectilinear airflow module housing having opposing front and rear faces, opposing side faces and opposing top and bottom faces, the front face of the airflow module housing comprising a solid blocking surface in facing relation to the data devices, a selected one of the top or bottom faces of the airflow module housing having a third vent aperture extending therethrough, a selected one of the side faces of the airflow module housing having a fourth vent aperture extending therethrough, the airflow module housing in contacting engagement with the electronics module housing so that the first vent aperture is in facing relation and fluidic communication with the third vent aperture; and
   a fan assembly disposed within the enclosure housing adjacent the electronics module and the airflow module, the fan assembly configured to draw cooling air from the front end of the enclosure housing to the rear end of the enclosure housing along a first path that passes from the inlet opening of the front face of the electronics module and out the second vent aperture and along a separate, second path that passes through the first vent aperture, the third vent aperture and the fourth vent aperture.

2. The enclosure of claim 1, wherein the top face of the electronics module housing contactingly engages the bottom face of the airflow module housing.

3. The enclosure of claim 1, wherein the top face of the airflow module housing contactingly engages the bottom face of the electronics module housing.

4. The enclosure of claim 1, wherein the second path of the cooling air passes through the first and third vent apertures to enter the airflow module housing and passes through the fourth vent aperture to exit the airflow module housing.

5. The enclosure of claim 1, further comprising a midplane to provide electrical interconnection paths between the data devices and the control electronics, wherein the cooling air sequentially passes adjacent the data devices, the midplane and into the inlet opening of the front face of the electronics module housing, and wherein the front face of the airflow module housing blocks said airflow from entering an interior of the airflow module housing.

6. The enclosure of claim 5, wherein the electronics module housing has a first overall length from the front face to the rear face thereof that nominally extends from the midplane to the rear end of the enclosure housing, the airflow module housing has a second overall length from the front face to the rear face thereof less than the first overall length, and the rear face of the electronics module housing is nominally aligned with the rear face of the airflow module housing at the rear end of the enclosure housing.

7. The enclosure of claim 1, further comprising a fifth vent aperture extending through the remaining one of the side faces of the electronics module housing and a sixth vent aperture extending through the remaining one of the side faces of the airflow module housing, the second and fourth vent apertures nominally aligned along a first plane and the fifth and sixth vent apertures nominally aligned along a second plane nominally parallel to the first plane.

8. The enclosure of claim 7, further comprising spaced apart first and second power supplies disposed within the enclosure housing adjacent the rear end thereof so that the electronics module and the airflow module are disposed therebetween, each of the first and second power supplies comprising a fan assembly that draws the cooling air through the enclosure housing, the first power supply comprising a housing having a first power supply vent aperture in fluidic communication with the second and fourth vent apertures, the second power supply comprising a housing having a second power supply vent aperture in fluidic communication with the fifth and sixth vent apertures.

9. The enclosure of claim 1, wherein the airflow module housing is characterized as an empty housing without an electronics module therein.

10. An enclosure, comprising:
   an enclosure housing having a length from a first end to a second end;
   a fan assembly disposed within the enclosure housing adjacent the second end to establish a cooling airflow that passes from the first end to the second end of the enclosure housing;
   a plurality of data devices arranged within the first end of the enclosure housing;
   an electronics module arranged within the second end of the enclosure housing comprising control electronics associated with the data devices within an electronics module housing comprising an inlet opening, a first vent aperture extending out a side surface parallel to the length of the enclosure housing and a second vent aperture extending out a top surface orthogonal to the side surface;

a midplane arranged within a medial portion of the enclosure housing to provide electrical interconnection between the data devices and the electronics module; and an airflow module adjacent the electronics module having a closed blocked surface in facing relation to the midplane, a third vent aperture in contacting engagement and fluidic alignment with the second vent aperture and a fourth vent aperture extending out a side surface aligned with the side surface of the electronics module housing.

11. The enclosure of claim 10, wherein the fan assembly draws cooling air through the inlet opening of the electronics module housing, the cooling air dividing into a first portion that passes out of the electronics module housing through the second vent aperture to the fan assembly, and into a second portion that passes through the first and third vent apertures into the airflow module housing and out of the airflow module housing through the fourth vent aperture to the fan assembly.

12. The enclosure of claim 10, wherein the electronics module housing has a first overall length from a first face to a second face thereof that nominally extends from the midplane to the second end of the enclosure housing, the airflow module housing has a second overall length from a first face to a second face thereof less than the first overall length, and the second face of the electronics module housing is nominally aligned with the second face of the airflow module housing at the second end of the enclosure housing.

13. The enclosure of claim 10, further comprising a fifth vent aperture extending through the remaining one of the side faces of the electronics module housing and a sixth vent aperture extending through the remaining one of the side faces of the airflow module housing, the second and fourth vent apertures nominally aligned along a first plane and the fifth and sixth vent apertures nominally aligned along a second plane nominally parallel to the first plane.

14. The enclosure of claim 13, further comprising spaced apart first and second power supplies disposed within the enclosure housing adjacent the second end thereof so that the electronics module and the airflow module are disposed therebetween, each of the first and second power supplies comprising a fan assembly that draws the cooling air through the enclosure housing, the first power supply comprising a housing having a first power supply vent aperture in fluidic communication with the second and fourth vent apertures, the second power supply comprising a housing having a second power supply vent aperture in fluidic communication with the fifth and sixth vent apertures.

15. The enclosure of claim 10, wherein the airflow module housing is characterized as an empty housing without an electronics module therein, and wherein the airflow module housing is in a stacked arrangement with the electronics module and has a closed blocked surface in facing relation to the midplane.

16. The enclosure of claim 10, wherein the fan assembly draws a flow of cooling air through the fourth vent aperture into the airflow module housing and through the third and first vent apertures into the electronics module housing.

17. The enclosure of claim 10, wherein the data devices comprise at least a selected one of hard disc drives (HDDs) and solid state drives (SSDs).

18. The enclosure of claim 10, wherein the electronics module housing has overall dimensions of nominally about 205.5 millimeters, mm in a first direction by about 34.5 mm in a second direction, and by about 75 to about 300 mm in a third direction.

19. A system comprising:

an enclosure housing having a front end and a rear end;

a plurality of data devices arranged within the enclosure housing adjacent the front end thereof;

a fan assembly arranged within the enclosure housing adjacent the rear end thereof;

an electronics module disposed within the enclosure housing adjacent the fan assembly comprising control electronics for controlling the data devices, the electronics disposed within a rectilinear electronics module housing having opposing front and rear faces, opposing side faces and opposing top and bottom faces, the front face of the electronics module housing having an inlet opening in facing relation to the data devices, a selected one of the top or bottom faces of the electronics module housing having a first vent aperture extending therethrough, a selected one of the opposing side faces of the electronics module housing having a second vent aperture extending therethrough;

an airflow module disposed within the enclosure housing adjacent the rear end thereof and in contacting alignment with the electronics module, the airflow module comprising an empty rectilinear airflow module housing having opposing front and rear faces, opposing side faces and opposing top and bottom faces, the front face of the airflow module housing comprising a solid blocking surface in facing relation to the data devices, a selected one of the top or bottom faces of the airflow module housing having a third vent aperture extending therethrough, a selected one of the side faces of the airflow module housing having a fourth vent aperture extending therethrough, the first vent aperture in facing relation and fluidic communication with the third vent aperture, the fan assembly drawing cooling air from the front end of the enclosure housing to the rear end of the cooling housing along a first path that passes through the inlet opening of the front face of the electronics module and out the second aperture and along a separate, second path that passes through the first and third vent apertures and the fourth vent aperture.

20. The system of claim 19, further comprising a midplane to provide electrical interconnection paths between the data devices and the control electronics, wherein the cooling air sequentially passes adjacent the data devices, the midplane and into the inlet opening of the front face of the electronics module housing, and wherein the front face of the airflow module housing blocks said airflow from entering an interior of the airflow module housing.

\* \* \* \* \*

UNITED STATES PATENT AND TRADEMARK OFFICE
CERTIFICATE OF CORRECTION

PATENT NO. : 9,084,375 B2  
APPLICATION NO. : 12/274041  
DATED : July 14, 2015  
INVENTOR(S) : Robert W. Hughes It is certified that error appears in the above-identified patent and that said Letters Patent is hereby corrected as shown below:

In the Title Page

In item (73) Assignee:
replace "Seagate Technology LLC, Cupertino, CA (US)"
with "Xyratex Technology Limited, Havant, Hampshire (UK)"

Signed and Sealed this
Twenty-ninth Day of March, 2016

Michelle K. Lee
*Director of the United States Patent and Trademark Office*